United States Patent [19]

Hill

[11] 3,936,860

[45] Feb. 3, 1976

[54] FABRICATION OF A SEMICONDUCTOR DEVICE

[76] Inventor: Bryan H. Hill, 305 Glenridge Road, Kettering, Ohio 45429

[22] Filed: Dec. 23, 1974

[21] Appl. No.: 535,768

Related U.S. Application Data

[60] Division of Ser. No. 423,854, Dec. 11, 1973, Pat. No. 3,873,373, which is a continuation-in-part of Ser. No. 269,359, July 6, 1972, abandoned.

[52] U.S. Cl. .................................... 357/23; 357/59
[51] Int. Cl.² ................... H01L 29/78; H01L 29/04
[58] Field of Search ........................... 357/23, 59, 91

[56] References Cited
UNITED STATES PATENTS 3,600,651  8/1971  Duncan................................. 357/23

*Primary Examiner*—Michael J. Lynch
*Assistant Examiner*—E. Wojciechowicz
*Attorney, Agent, or Firm*—Joseph E. Rusz; Cedric H. Kuhn

[57] ABSTRACT

A semiconductor material of a first conductivity type has one of its surfaces subjected to high energy oxygen ion implantation, thereby forming an oxide layer below that surface. A gate is formed by masking at least a portion of the surface, exposing the unmasked portion to ion radiation so as to implant impurity ions in the region of the semiconductor material between its unmasked surface and the upper side of the subsurface oxide layer, and metallizing the surface above the implanted region. After removal of the masking material, source and drain areas are formed by high energy ion implantation in the semiconductor material adjacent the lower side of the subsurface oxide layer, the areas having a conductivity opposite the first conductivity type. After windows to the source and drain areas are opened in the semiconductor material and subsurface oxide layer, the exposed surfaces of these areas are metallized.

5 Claims, 6 Drawing Figures

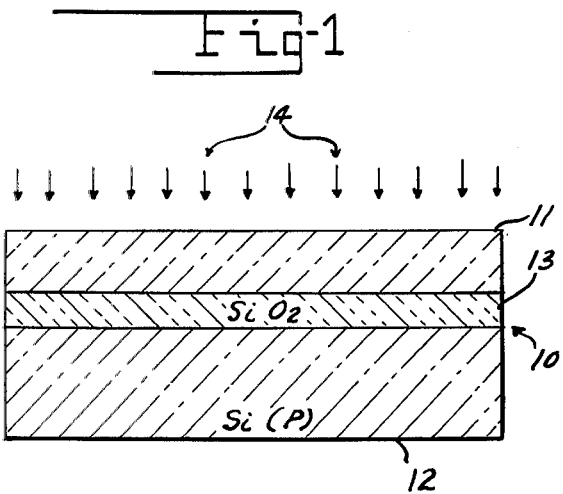
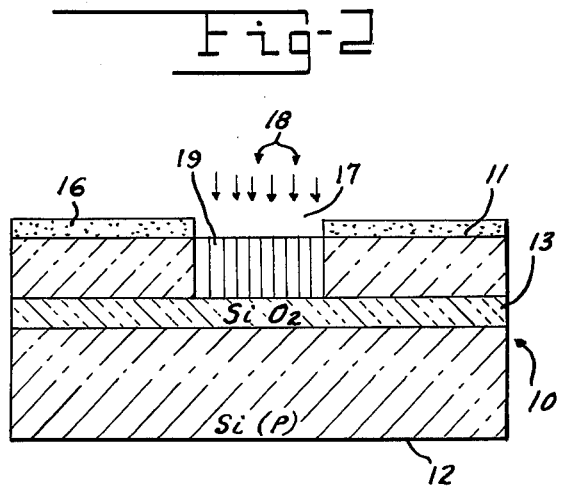
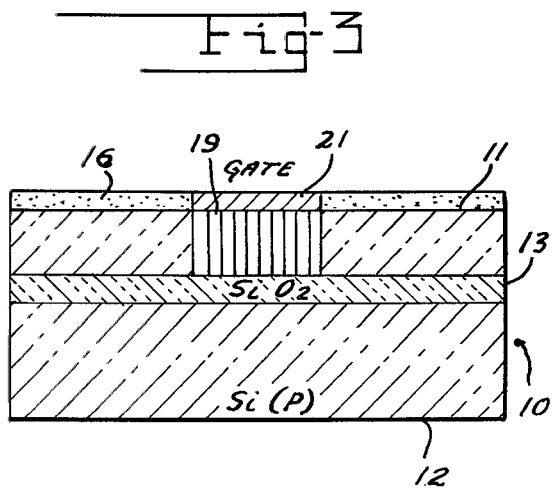
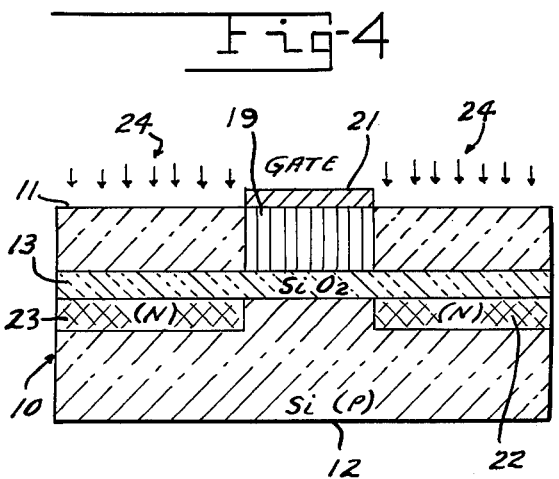
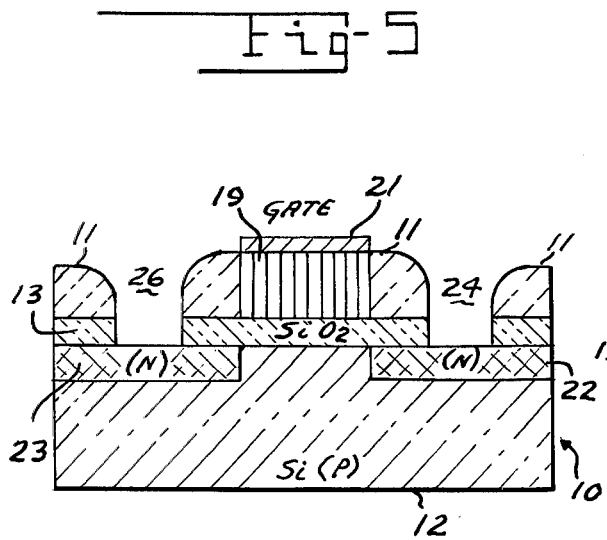
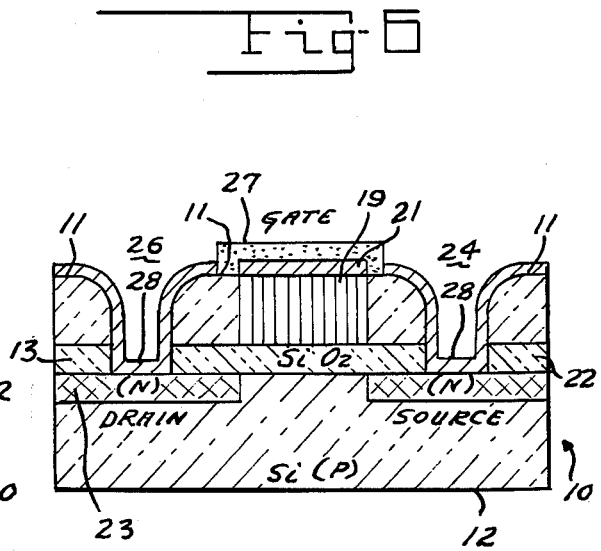

3,936,860

FABRICATION OF A SEMICONDUCTOR DEVICE

RIGHTS OF THE GOVERNMENT

There is reserved to the Government of the United States a nonexclusive, irrevocable, royalty-free license in the invention described herein with power to grant licenses for all governmental purposes.

This application is a division of copending application Ser. No. 423,854, filed Dec. 11, 1973, now U.S. Pat. No. 3,873,373 which is a continuation-in-part of application Ser. No. 269,359, filed July 6, 1972, and now abandoned.

FIELD OF THE INVENTION

This invention relates to a method for fabricating semiconductor devices. In one aspect it relates to a method for forming insulated gate field effect transistors. In another aspect it relates to an insulated gate, field effect transistor.

BACKGROUND OF THE INVENTION

Among the various kinds of semiconductor devices, one type that is well known in the art is the insulated gate, field effect transistor. For example, this type of transistor and its operation are described by S. R. Hofstein and F. P. Heiman in an article entitled "The Silicon Insulated-Gate Field-Effect Transistor" appearing in the Proceeding of the IEEE, 51, p. 1190 (September 1963). Furthermore a number of patents, such as U.S. Pat. Nos. 3,411,199; 3,472,712 and 3,513,364, have issued that describe methods for fabricating such semiconductor devices. This type of transistor is generally characterized by an arrangement in which the source and drain are spaced apart regions of the same conductivity formed on the same surface of a semiconductor body. The gate is positioned over the space between the source and drain regions and is separated therefrom by a layer of insulating material. The layer of insulating material is usually in the form of an oxide of the same element as the semiconductor body. For example, when the semiconductor body is silicon, the insulator for the gate is silicon dioxide. In preparing the silicon dioxide insulating layer, the usual practice is to oxidize the exposed surface of the silicon body. In order to fabricate a field effect transistor having reliable and reproducible characteristics, it is important that the insulator be of high purity. The introduction of trace contaminants, such as alkali ions, into the silicon dioxide, which may occur during the oxidation procedure, causes the silicon dioxide to be unstable. Because of the ion drift and surface instabilities in the silicon dioxide insulator, the field effect transistors made by prior art procedures are not always completely reliable.

It is an object of this invention to provide an improved method for the fabrication of an insulated gate, field effect device.

Another object of the invention is to provide an insulated gate, field effect transistor of improved reliability.

Other objects and advantages of the invention will become apparent to those skilled in the art upon consideration of the accompanying disclosure and the drawing in which FIGS. 1 through 6 illustrate diagrammatically the several steps followed in producing a semiconductor device according to the invention.

SUMMARY OF THE INVENTION

Broadly speaking, the present invention resides in a semiconductor device comprising a semiconductor body of a first conductivity type; an oxide insulating layer, formed by oxygen implantation, disposed intermediate the upper and lower surfaces of the semiconductor body; a source area and a drain area spaced apart from one another and positioned adjacent the lower surface of the insulating layer, each area having a conductivity opposite the first conductivity type; and a gate electrode positioned on the surface of the semiconductor body above the space separating the source and drain areas, the ohmic regions of the body between the gate and the insulating layer being degenerate by having impurity ions implanted therein. By providing an oxide insulating layer by oxygen implantation, the reliability of the device is improved by inhibiting ion drift and surface instabilities that are present in conventional devices. Furthermore, in making the transistor of this invention, it is possible to eliminate a passivation step since the device is fabricated below a layer of the conductive body.

Referring to FIG. 1 of the drawing, there is illustrated a semiconductor body 10 having opposing surfaces 11 and 12. It is to be understood that in the figures of the drawing only a small portion of a semiconductor wafer is depicted and that in actual practice a large number of units as described herein are simultaneously fabricated. As shown, the semiconductor body is a P-type monocrystalline silicon although other materials, such as monocrystalline germanium, can be used. Furthermore, the semiconductor can be an N-type material, for example, an N-type single crystal silicon. Formed within body 10 intermediate its top surface 11 and its bottom surface 12 is a layer of film 13 of silicon dioxide.

The subsurface layer 13 of silicon dioxide is produced by high energy oxygen implantation, utilizing a suitable high energy accelerator, such as a Van de Graff accelerator. Preferably, the layer has a thickness of about 1,000 to 2,000 A. and is disposed at about 0.5 to 1.0 micron below surface 11. Such a layer can be formed by first directing onto surface 11 a one million electron volt (MeV) beam 14 of oxygen ions having an intensity of $12 \times 10^{12}$ ions/cm$^2$ for a period of about $10^2$ to $10^3$ seconds to give a fluence of about $10^{15}$ to $10^{16}$ ions/cm$^2$. After the oxygen implantation, the silicon body is annealed by heating it at about 1,100° to 1,300°C for a period of about 3 to 6 hours. As a result of this annealing step, a layer of film 13 of silicon dioxide is formed and any damage caused by the ion implantation is removed. It is to be understood that the beam intensity and period of impingement can be varied from those indicated above so as to obtain a similar oxide layer or, for example, one with a lesser or greater thickness disposed at a lesser or greater depth below surface 11. However, the specific conditions set forth above are those that are desirably employed so as to provide an oxide layer having the preferred thickness and depth.

As shown in FIG. 2, a masking material 16 is now formed on surface 11. A suitable masking material may be a commercially available photoresist material. The thickness of the masking is such as to prevent ions from penetrating through the mask. The thickness of the material usually falls in the range of 0.5 to 0.75 mil. The mask in the form of a photoresist layer is developed after exposure to a suitable light pattern. By use of a suitable solvent, at least one portion of the photoresist unexposed to light is removed, thereby providing an opening 17 therein to the silicon body. While only a single opening is illustrated, it is to be understood that in fabricating a device a plurality of openings may be created in the mask.

The surface area of body 10 exposed by opening 17 in the mask is now bombarded with a beam of impurity ions 18 so as to provide a highly conductive region 19 between the surface of body 10 exposed by opening 17 and silicon dioxide layer 13. Assuming as before that body 10 is a P-type semiconductor as a result of containing P-type dopants, such as boron, aluminum, gallium and indium, then the impurity ions implanted in region 19 are preferably of the N-type, such as phosphorus, arsenic, antimony or bismuth. While P-type dopants can be implanted in region 19, as a practical matter it is desirable to utilize the same type of impurity ions as are used in doping the source and drain, i.e., N-type dopants with a P-type semiconductor. With an N-type semiconductor, it is, of course, preferred to implant P-type dopants in region 19.

Implantation of the N-type impurity ions in region 19 of body 10 is accomplished by employing a suitable accelerator, such as a Van de Graff accelerator. Initially, a one million electron volt beam 18 having an intensity of $12 \times 10^{12}$ ions/cm$^2$ is directed onto the surface of opening 17 for a period of time sufficient for the N-type dopants to penetrate up to silicon dioxide layer 13. The intensity of the beam is then decreased in increments until region 19 becomes degenerate, i.e., highly conductive. In this degenerate state, region 19 contains sufficient impurity ions, e.g., about $10^{19}$ to $10^{20}$ ions per cubic centimeter, so as to render region 19 about as conductive as metal. As a result, there is substantially no drop in potential between the gate electrode to be described in the next paragraph and the silicon dioxide layer.

After implantation of the N-type ions in region 19, the exposed top surface of body 10 is metallized to provide a gate electrode 21. A conductive metal is deposited on the exposed surface by any conventional method, e.g., by vacuum evaporation. It is often preferred to utilize aluminum as the metal although other metals, such as chrome-silver or chrome-gold can be used. When employing the latter metals, a thin film of chromium is first flashed on the exposed surface after which a layer of silver or gold is deposited on the chromium. This step is shown in FIG. 3 of the drawing.

After formation of the gate electrode, photoresist layer 16 is removed with a suitable stripper, such as methylene chloride. Thus, as shown in FIG. 4, there remains on surface 11 of body 10 only gate electrode 21. The next step in the method for fabricating the semiconductor device of this invention involves the formation of source 22 and drain 23. The source and drain are produced by the high energy implantation of N-type dopants, using a suitable high energy accelerator, such as a Van de Graff accelerator. (When body 10 is an N-type semiconductor, it will be appreciated that P-type dopants are utilized in forming the source and drain.) The intensity of ion beam 24 must be sufficient to penetrate the portion of body 10 above silicon dioxide layer 13 as well as layer 13 itself in order to provide the source and drain. Thus, impingement of a 1.1 to 1.4 million electron volt beam of N-type impurity ions having an intensity of $12 \times 10^{12}$ ions/cm$^2$ for a period of $10^2$ to $10^3$ seconds is satisfactory for forming a source and a drain having a depth of 1.0 to 1.6 microns. It is within the scope of the invention to etch away a portion of the body above oxide layer 13 in which event less energy is required to obtain the desired doping.

In forming the source and drain, metallic gate electrode 21 functions as a mask. Because of the use of the gate electrode as the mask, there is no overlap between the gate and the source and/or drain regions. Accordingly, region 19 with its gate electrode 21 can be termed a self-aligned gate which obviates the incidence of Miller's capacitance between the gate and source and/or drain. In this regard the gate electrode has a thickness which is sufficient to prevent ion penetration of region 19 during formation of the source and drain. The thickness of the gate electrode usually falls in the range of 0.5 to 0.75 mil. After formation of the source and drain, body 10 is annealed at a temperature of about 500° to 600°C for a period of about 0.5 to 1 hour. The annealing step removes any damage that may be caused by the ion implantation and also activates the implanted ions.

As shown in FIG. 5, windows 24 and 26 to the source and drain are opened in body 10 above oxide layer 13 and in the oxide layer itself. This is accomplished by the use of a suitable etchant, such as a hydrofluoric acid solution. In carrying out the etching step, the layer of the silicon body above the oxide layer is preferably etched so that the sides of the windows flare outwardly. This structure facilitates metallization of the source and drain and the attachment of leads thereto.

As illustrated in FIG. 6, a mask 27, which can be photoresist material as described hereinbefore, is next formed over gate electrode 21. In order to completely mask the gate electrode, the portion of top surface 11 of body 10 adjacent the perimeter of the electrode is also masked with the photoresist material. The thickness of this photoresist material is generally in the range of 0.03 to 0.04 mil. A metal 28 is thereafter deposited on the surfaces of the source and drain regions to provide metal contacts. In forming the metal contacts, the same procedure used in providing gate electrode 21 can be conveniently followed. In addition to covering the exposed surfaces of the source and drain, the metal covers the exposed sides of the opening in oxide layer 13 and body 10. However, it is to be understood that it is not necessary that the metal covers the entire exposed surfaces of the source and drain, nor does the metal have to cover entirely the sides of the windows. It is sufficient if the metal is deposited only on a portion of the source and drain while extending upwardly on the sides of the windows to a location that will facilitate the connection of electrical leads. After metal contacts 28 have been deposited, photoresist mask 27 is removed from gate electrode 21 by dissolving it in a suitable solvent, thereby providing an insulated gate, field effect transistor.

EXAMPLE

An array of insulated gate, field effect transistors is fabricated in accordance with the method of this invention. Initially, a one MeV beam of oxygen ions having an intensity of $12 \times 10^{12}$ ions/cm$^2$ is directed for a period of 500 seconds onto the surface of a single crystal silicon wafer having a P-type conductivity. The wafer with implanted oxygen ions is then annealed by heating in an oven at 1,200°C for a period of 4 hours. A silicon dioxide layer having a thickness of about 1,500 A. is thereby formed within the wafer about 0.75 micron below its top surface. After the wafer is allowed to cool to room temperature, the surface of the wafer is masked with a commercially available photoresist material. The photoresist layer is developed after exposure to a predetermined light pattern. Using methylene chloride as the solvent those portions of the photoresist unexposed to light are removed, thereby providing a plurality of openings in the photoresist to the surface of the silicon wafer. The surface of the wafer is now bombarded with a beam of phosphorus ions so as to provide a plurality of degenerate regions between the surfaces of the aforementioned openings and the silicon dioxide layer. The surfaces of the openings are then metallized with aluminum by vacuum evaporation after which methylene chloride is used to strip the photoresist layer from the wafer surface. There is thus formed on that surface a plurality of gate electrodes having a thickness of about 0.75 mil.

After formation of the gate electrodes, a 1.2 MeV beam of phosphorus ions having an intensity of $12 \times 10^{12}$ ions/cm$^2$ is directed for a period of 750 seconds onto the surface of the silicon wafer. The gate electrodes function as masks so that a source and a drain having a depth of about 1.3 microns are formed below and adjacent the oxide layer for each gate in the silicon body. Because the gate electrodes function as masks, there is no overlap between the gate and the source and drain region, thereby preventing the occurrence of Miller's capacitance.

After the plurality of source and drain regions are formed, the wafer is annealed at 550°C for 45 minutes. The wafer is then permitted to cool to room temperature after which windows to the source and drain regions are opened by etching away with a solution of hydrofluoric acid the layers of silicon and silicon dioxide above the regions. The etching step is carried out so that the top of the windows flare outwardly, thereby providing an upper edge that is rounded. The gates are then masked with a photoresist material, and aluminum is deposited on the exposed surfaces of the source and drain areas and on the contiguous sides of the flared windows. Thereafter, methylene chloride is used to strip the photoresist material from the gate electrodes. Suitable electrical leads may then be attached by any convenient method, such as by ball-bonding, to the gate electrode and to the metal contacts of the source and drain areas. The wafer is now divided into a plurality of units which are then encased by well known techniques.

The transistors fabricated as described in the foregoing example can be advantageously used in linear and digital circuits. Furthermore, the method of this invention lends itself to the fabrication of transistors having unconventional geometries while overcoming the problems associated with the prior art techniques of fabricating insulated gate, field effect transistors.

As will be apparent to those skilled in the art, modifications of the present invention can be made in view of the foregoing disclosure. Such modifications fall within the spirit and scope of the invention.

I claim:

1. An insulated gate, field effect transistor comprising a semiconductor body of a first conductivity type having a top and a bottom surface; a layer of an oxide of the semiconductor disposed intermediate the top and bottom surfaces of the semiconductor body; a source area and a drain area positioned in the semiconductor body adjacent the lower surface of the oxide layer and separated from one another by a region of the body between the top surface of the body and the upper surface of the oxide layer and a region of the body below the lower surface of the oxide layer, each area having a conductivity type opposite the first conductivity type; and a gate electrode positioned on the top surface of the region of the semiconductor body between the top surface of the body and the upper surface of the oxide layer, the region being in a degenerate state.

2. The transistor of claim 1 in which the semiconductor body is a P-type monocrystalline silicon; the source and drain areas have an N-type conductivity; and the region of the body on which the gate electrode is positioned contains implanted N-type impurity ions.

3. The transistor of claim 1 in which the oxide layer has a thickness in the range of about 1,000 to 2,000 A. and the oxide layer is disposed at about 0.5 to 1.0 micron below the surface of the body.

4. The transistor of claim 1 in which the semiconductor body is an N-type monocrystalline silicon; the source and drain areas have a P-type conductivity; and the region of the body on which the gate electrode is positioned contains implanted P-type impurity ions.

5. The transistor of claim 1 which comprises openings extending from the top surface of the semiconductor body through the oxide layer, thereby exposing at least a portion of the surfaces of the source and drain areas; and metal contacts attached to exposed surfaces of the source and drain areas.

* * * * *